United States Patent
Welch et al.

(10) Patent No.: US 6,647,918 B1
(45) Date of Patent: Nov. 18, 2003

(54) DOUBLE SLIT-VALVE DOORS FOR PLASMA PROCESSING

(75) Inventors: Michael D. Welch, Livermore, CA (US); Homgqing Shan, Cupertino, CA (US); Paul E. Luscher, Sunnyvale, CA (US); Evans Y. Lee, Milpitas, CA (US); James D. Carducci, Sunnyvale, CA (US); Siamak Salimian, Sunnyvale, CA (US)

(73) Assignee: Applied Materials, Inc, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/711,191

(22) Filed: Nov. 13, 2000

Related U.S. Application Data

(62) Division of application No. 09/111,251, filed on Jul. 3, 1998, now Pat. No. 6,192,827.

(51) Int. Cl.⁷ .............................................. C23C 16/00
(52) U.S. Cl. ............. 118/723 R; 118/715; 118/723 E; 118/733; 156/345.31; 156/345.32; 156/345.43; 156/916
(58) Field of Search ................. 118/715, 725, 118/729, 733, 723 R, 723 MW, 723 E; 156/345, 345.31, 345.32, 916, 345.41, 345.43

(56) References Cited

U.S. PATENT DOCUMENTS

| | | | | |
|---|---|---|---|---|
| 3,690,037 A | | 9/1972 | Kempel | 49/380 |
| 3,935,950 A | * | 2/1976 | Burch | 214/1 BB |
| 4,458,582 A | * | 7/1984 | Linton | 91/506 |
| 4,632,624 A | * | 12/1986 | Mirkovich | 118/728 |
| 5,194,793 A | * | 3/1993 | Niimi | 318/568 |
| 5,223,123 A | | 6/1993 | Koch | 204/415 |
| 5,334,922 A | * | 8/1994 | Manini | 318/772 |
| 5,592,581 A | | 1/1997 | Okase | 392/418 |
| 5,613,821 A | | 3/1997 | Muka et al. | 414/217 |
| 5,844,195 A | | 12/1998 | Fairbairn et al. | 219/121.43 |
| 5,846,332 A | | 12/1998 | Zhao et al. | 118/728 |
| 6,074,518 A | * | 6/2000 | Imafuku et al. | 156/345.46 |
| 6,111,225 A | * | 8/2000 | Ohkase | 118/725 |

FOREIGN PATENT DOCUMENTS

WO     WO97/31389     *     8/1997

OTHER PUBLICATIONS

Webster's Third New International Dictionary, Mirriam--Webster, 1993, pp. 524, 525, 813 and 1316.*

* cited by examiner

Primary Examiner—Richard Bueker
(74) Attorney, Agent, or Firm—Roberts, Abokhair & Mardula LLC; Joseph Bach

(57) ABSTRACT

In a substrate vacuum processing chamber, a second inner slit passage door apparatus and method to supplement the normal slit valve and its door at the outside of the chamber. The inner slit passage door, blocks the slit passage at or adjacent the substrate processing location in a vacuum processing chamber to prevent process byproducts from depositing on the inner surfaces of the slit passage beyond the slit passage door and improves the uniformity of plasma in the processing chamber by eliminating a large cavity adjacent to the substrate processing location into which the plasma would otherwise expand. The inner slit passage door is configured and positioned in such a way as to avoid generating particles from the opening and closing motion of the second slit valve door, as it does not rub against any element of the chamber during its motion and the inner slit passage door is positioned with a predetermined gap from adjacent pieces and the door configuration includes beveled surfaces to further reduce the chance for particle generation, even when there is deposition of process byproducts on the door and its adjacent surfaces.

43 Claims, 12 Drawing Sheets

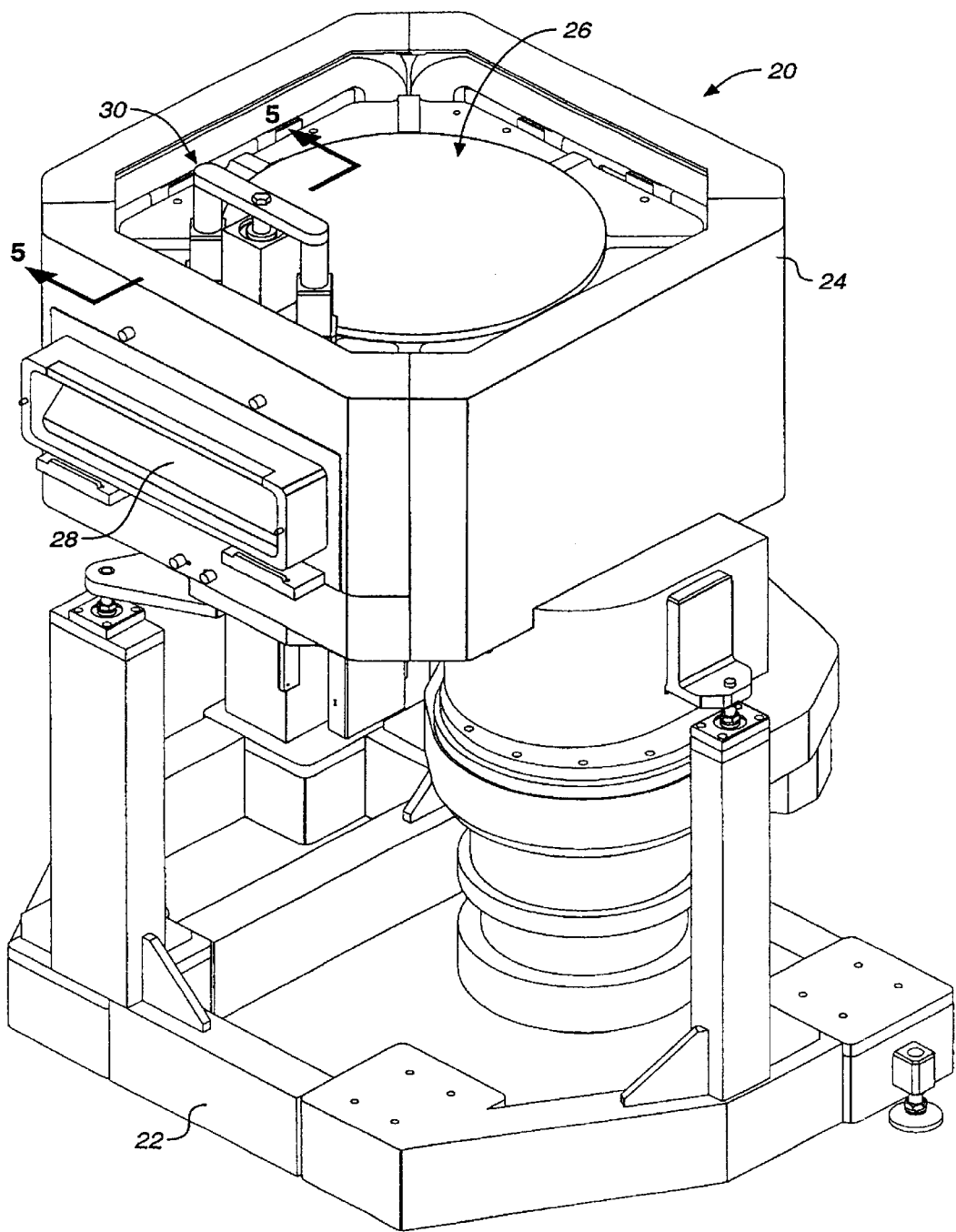
FIG._1

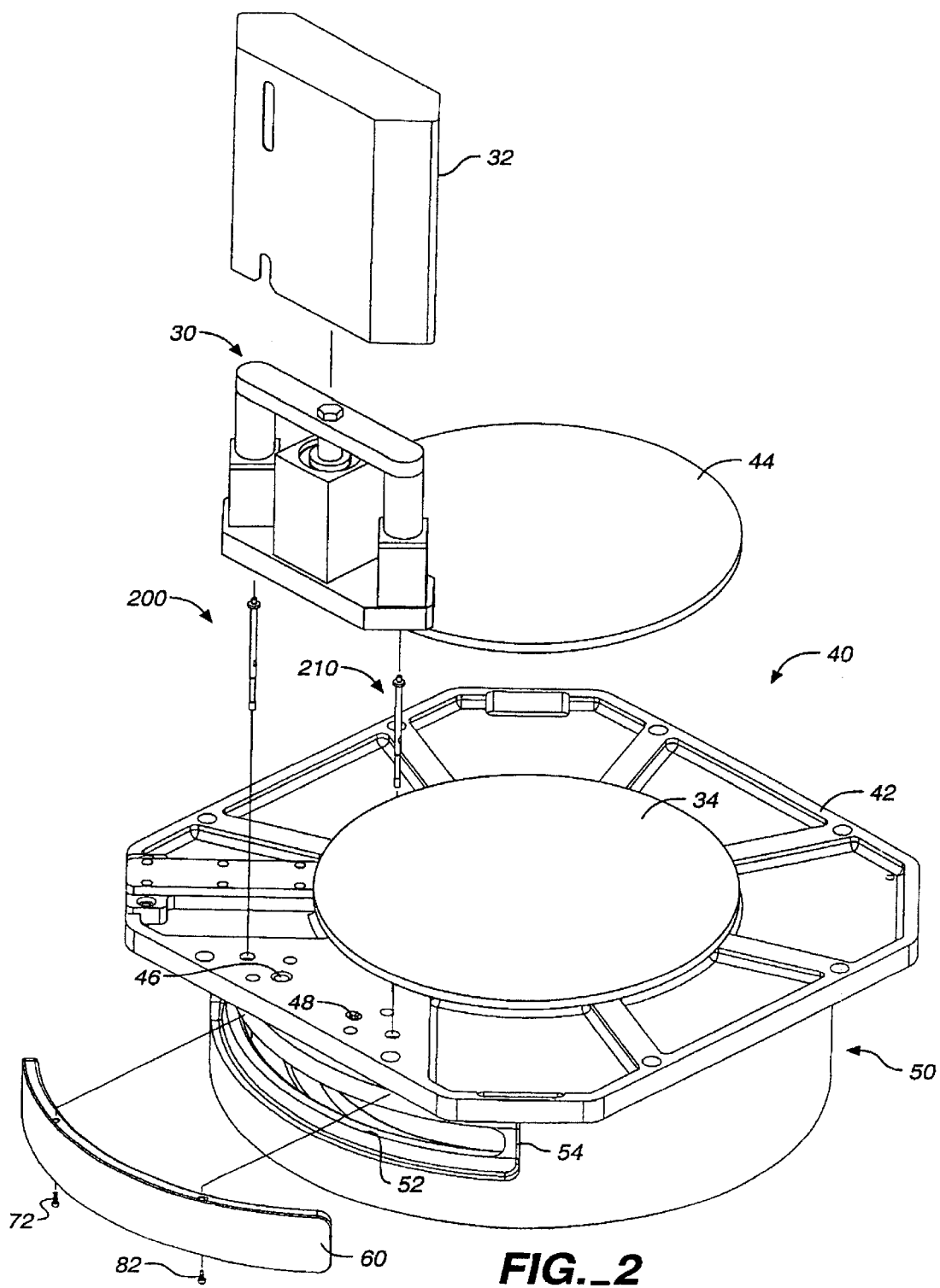
FIG._2

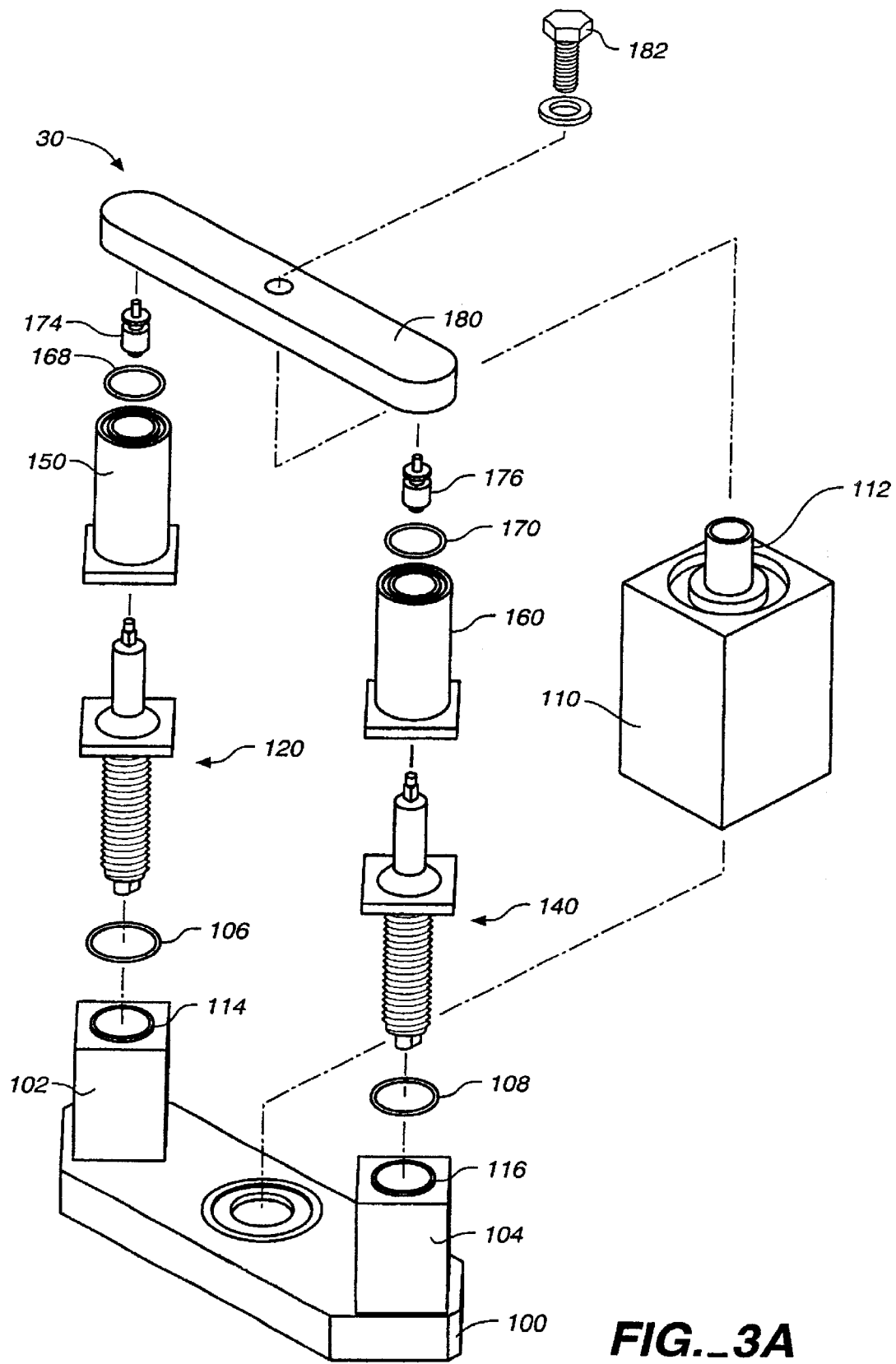
FIG._3A

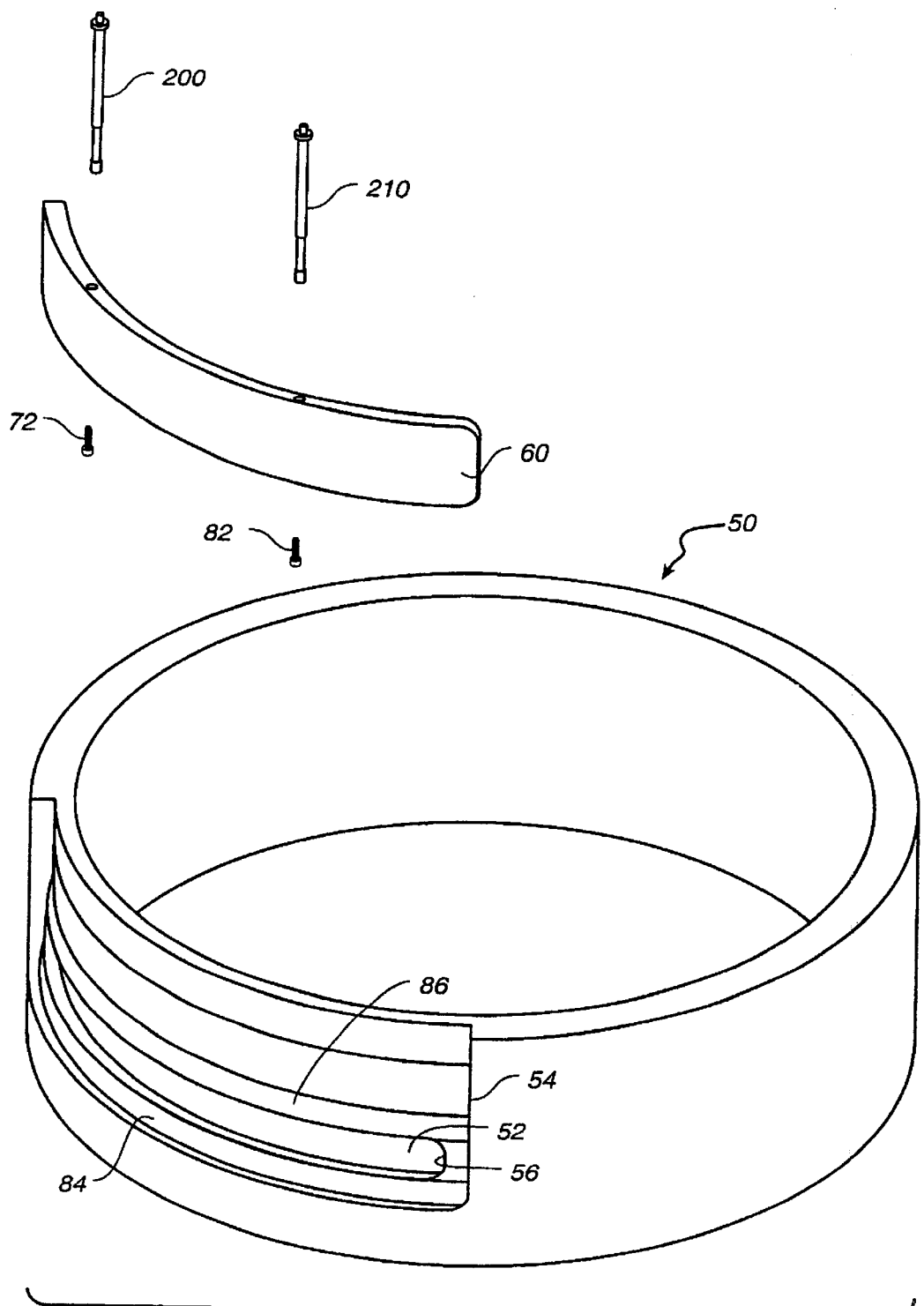
FIG._3B

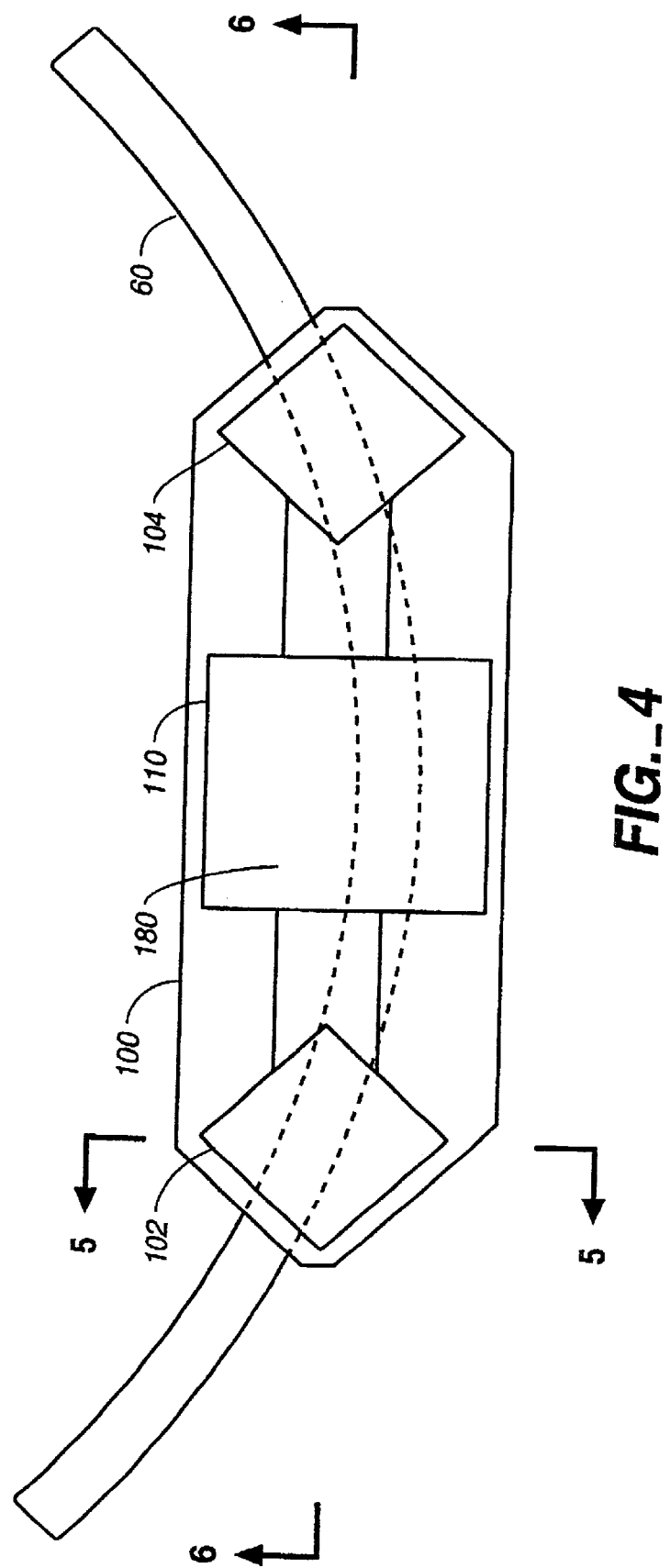
FIG._4

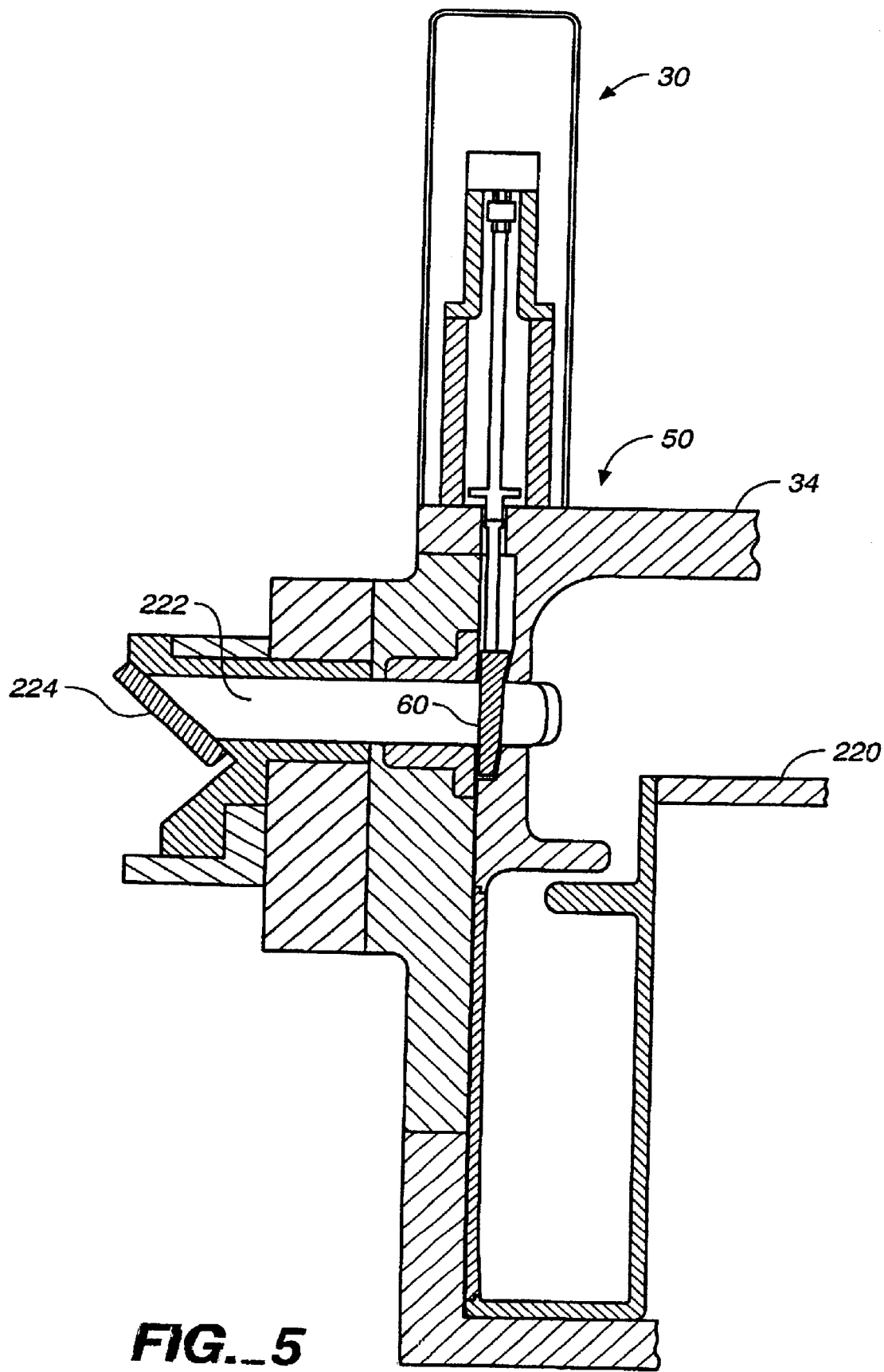
FIG._5

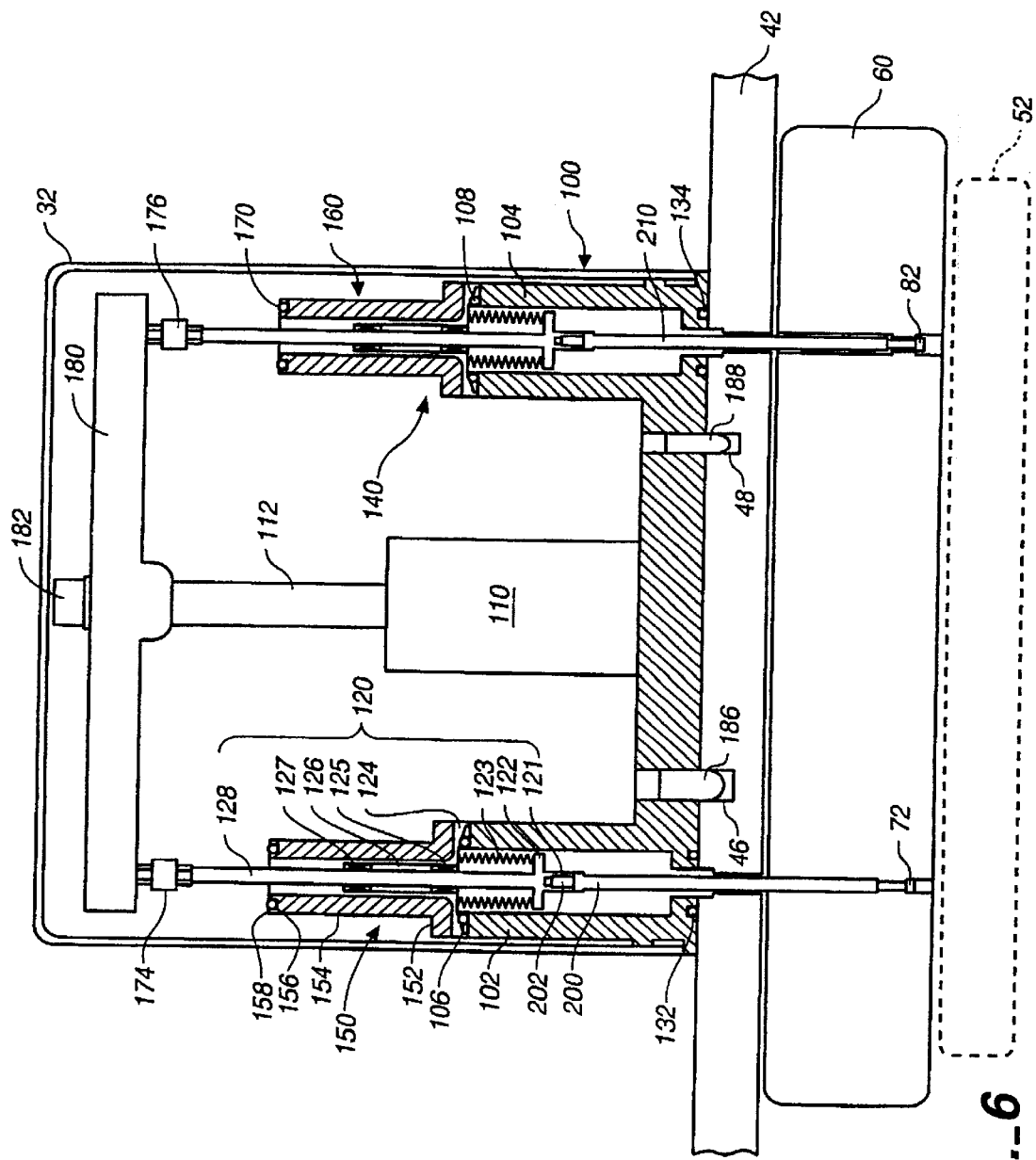
FIG._6

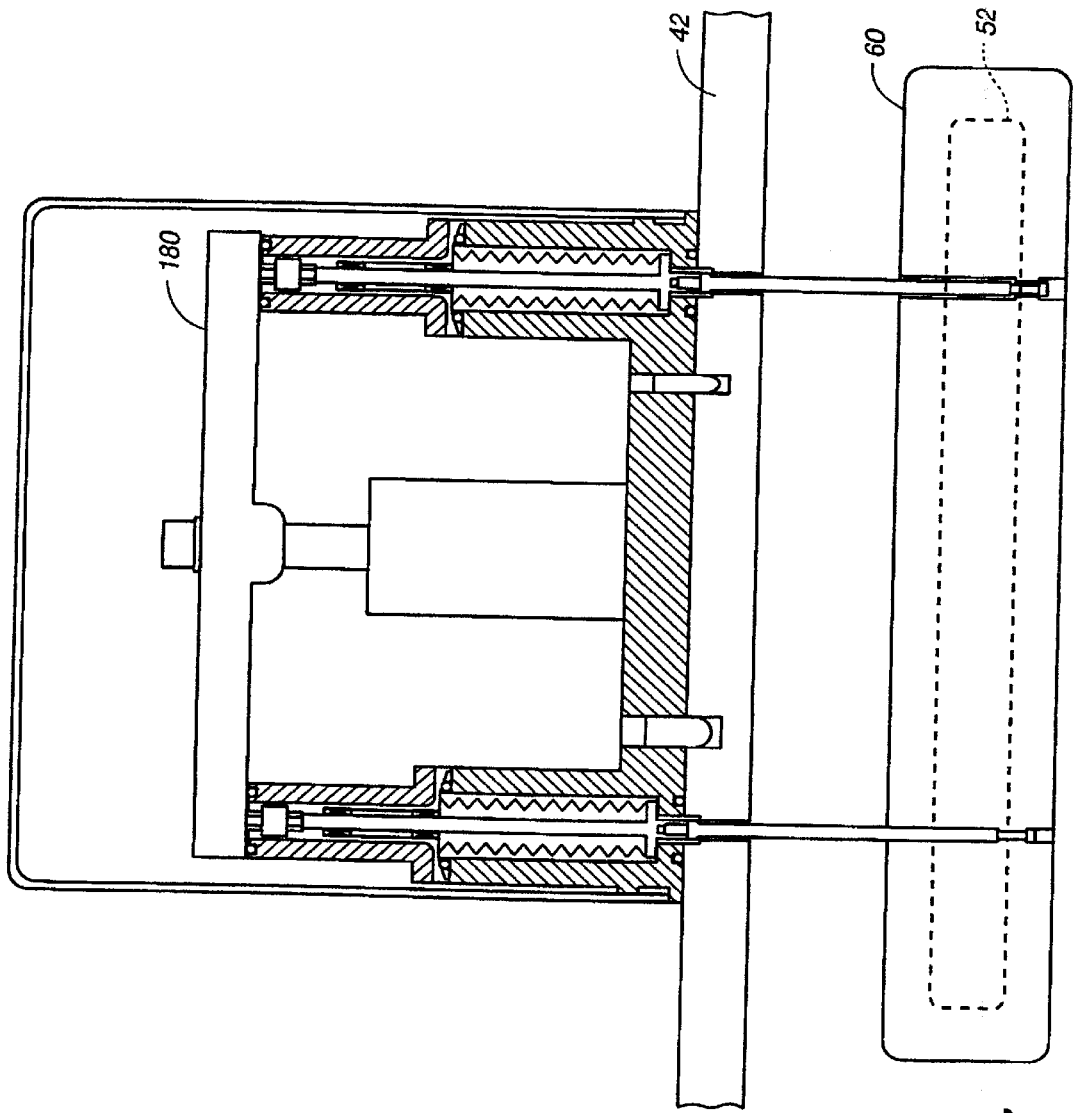

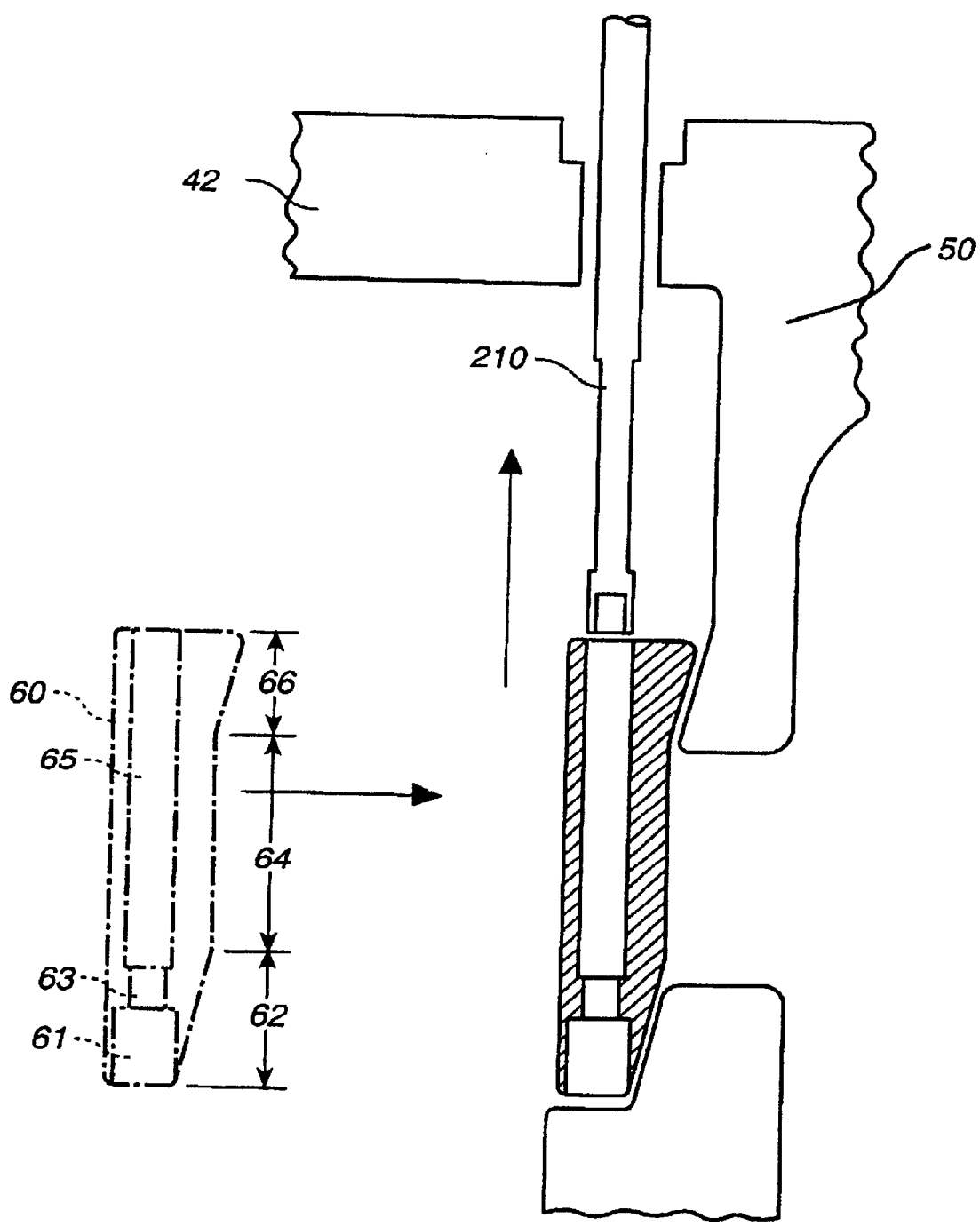
FIG._8

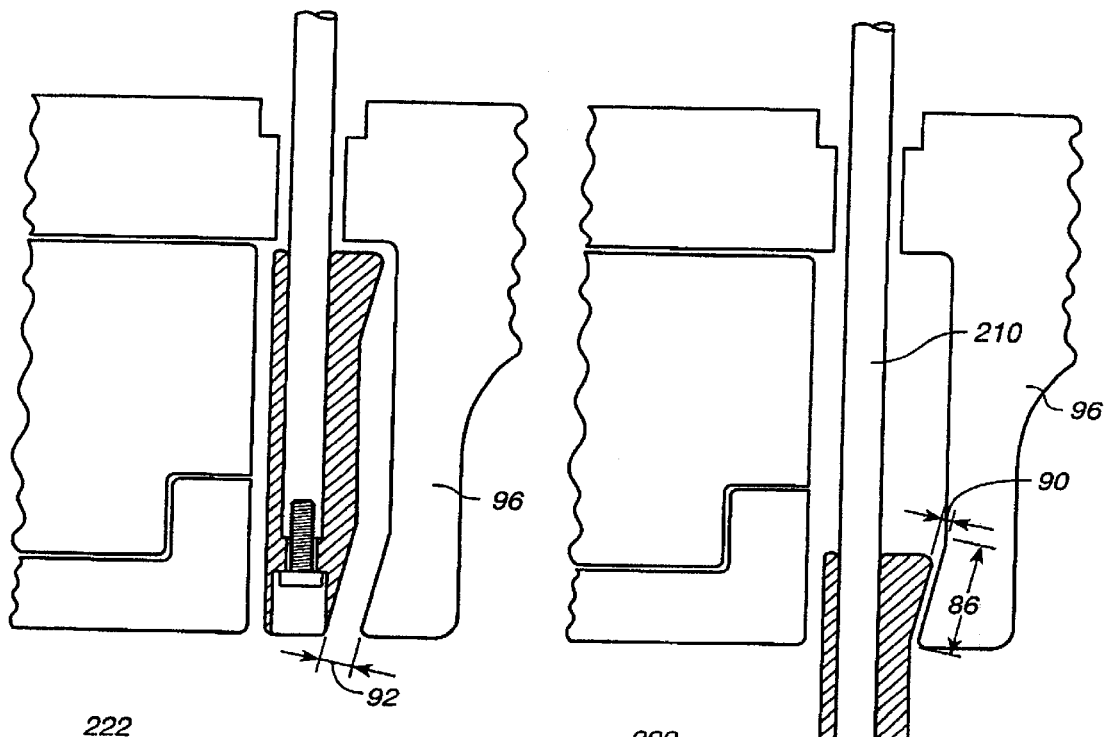
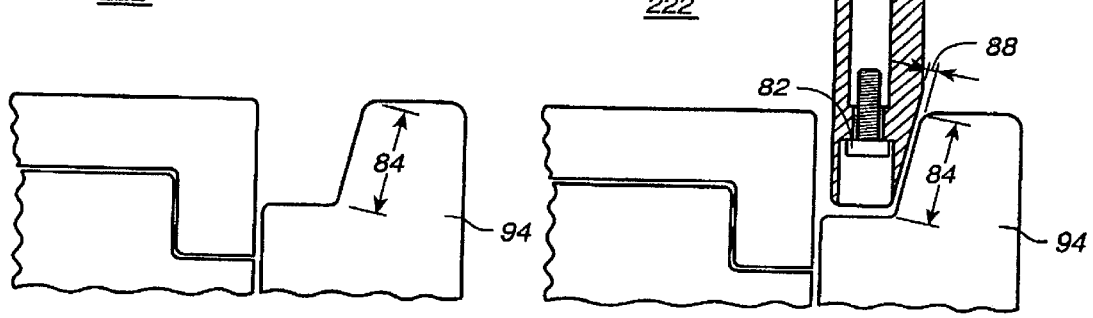
FIG._9     FIG._10

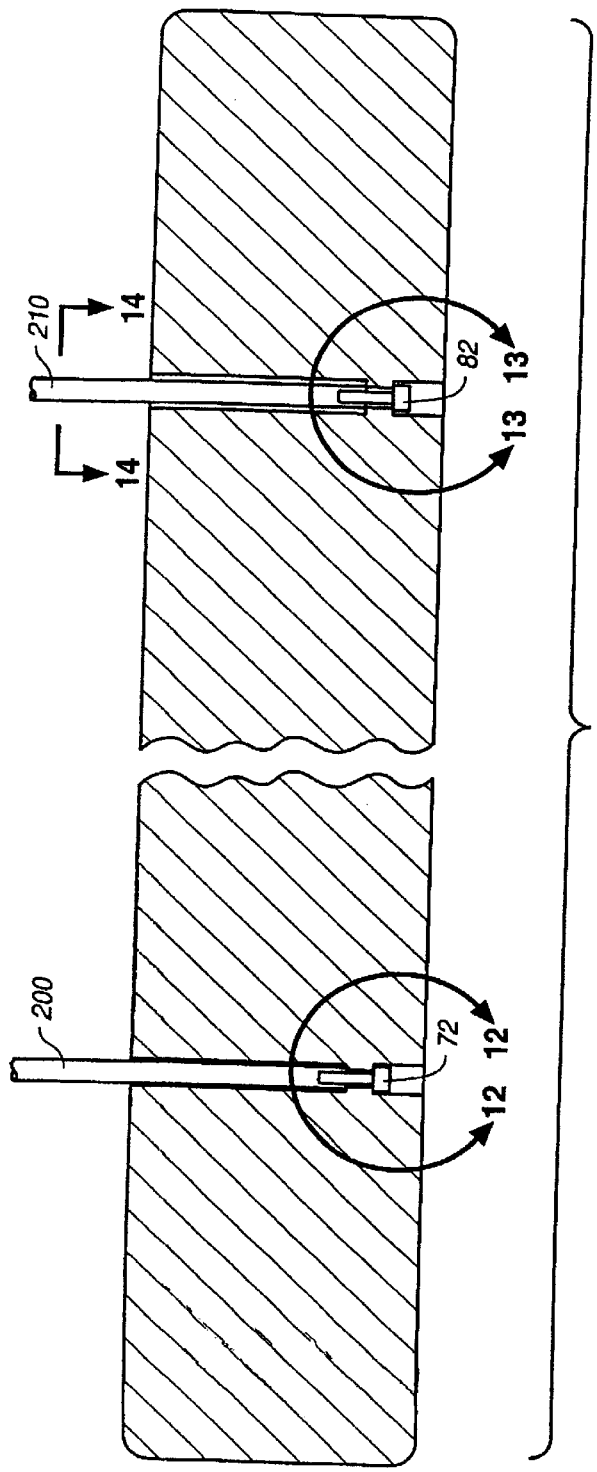
FIG._11
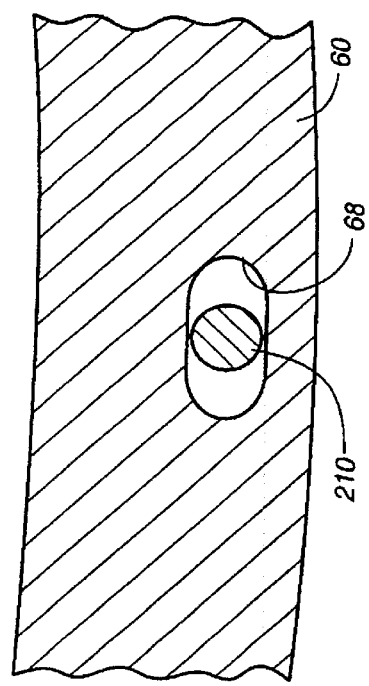
FIG._14

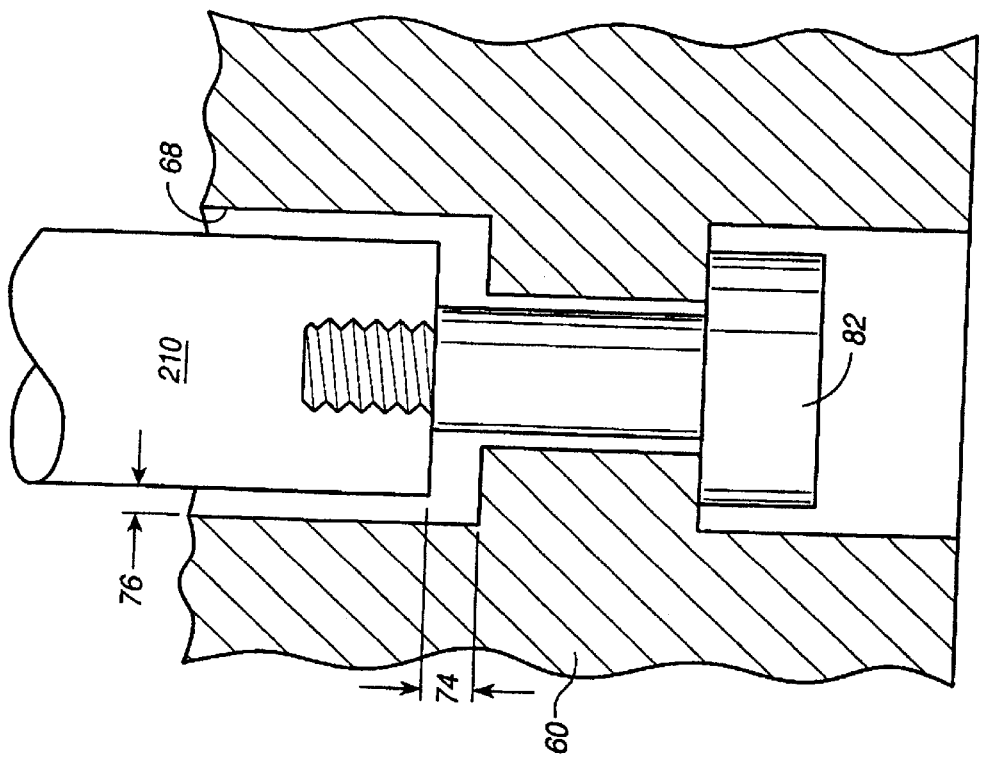
FIG._13
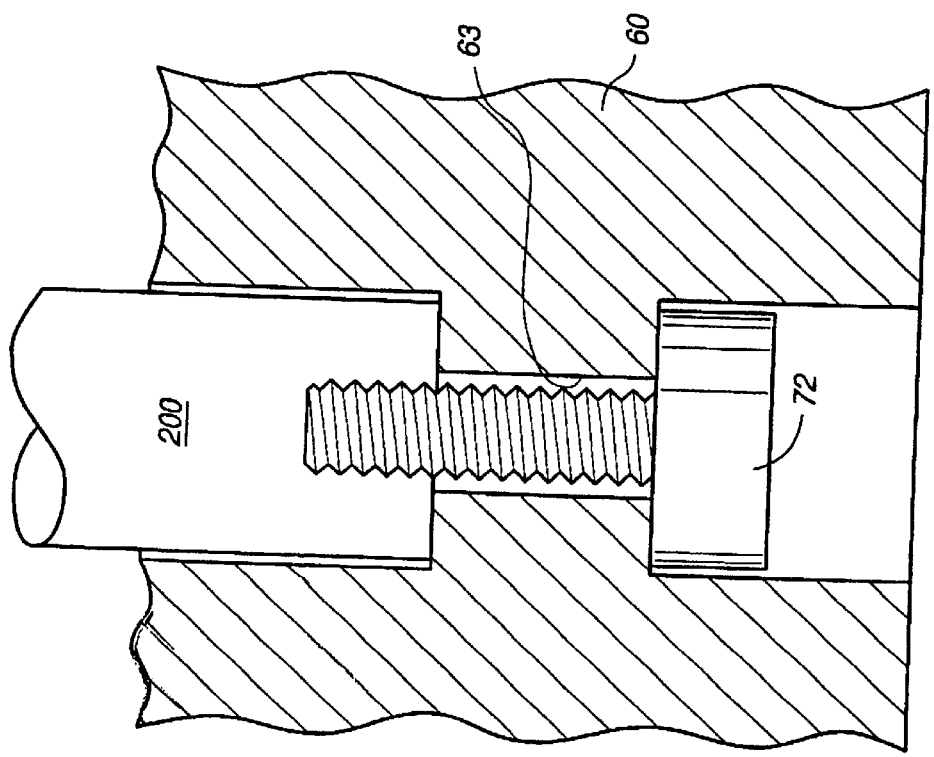
FIG._12

DOUBLE SLIT-VALVE DOORS FOR PLASMA PROCESSING

CROSS REFERENCE TO RELATED APPLICATIONS

This application is a divisional of U.S. application No. 09/111,251, filed Jul. 3, 1998, now U.S. Pat. No. 6,192,827, which is incorporated herein by reference, in its entirety, for all purposes.

FIELD OF THE INVENTION

This invention relates to the construction of vacuum processing chambers used in processing of substrates for deposition and removal of materials. A particular chamber configuration using a specialized liner is disclosed.

BACKGROUND OF THE INVENTION

In general, vacuum processing chambers for processing substrates include a substrate transfer opening, commonly known as a slit valve. A slit passage associated with the slit valve is commonly used to transfer substrates into and out of the processing chamber between processing cycles. Commonly a robot extends from a cluster tool through a slit valve opening through the slit valve passage to deliver or remove a substrate to be processed to or from a processing location in the vacuum processing chamber. Once the substrate transfer at the substrate processing location is complete, the robot is retracted through the slit valve opening and back into the cluster tool. The slit valve opening is commonly sealed at an outside surface of the chamber body by a blocking plate which moves over the slit valve opening, in a coordinated motion with the movement of the robot and substrate into and out of the processing chamber. Plasma is often used in a processing chamber to enhance the process being performed. In a typical arrangement of a vacuum processing chamber, where a plasma is utilized to initiate or enhance process activity, the processing chamber and all internal services exposed to the plasma and the chemical by products are affected and can become coated with chemical byproducts of the process being performed.

Typically, the walls of the processing chamber are at least several inches thick to provide a sturdy chamber wall for processing activity. Thus, the opening in the side of the processing chamber which allows substrates to be transferred into and out of the chamber, the slit valve passage, presents a large tunnel-like opening which creates a geometric discontinuity at the inside surface of the processing chamber. The presence of a large cavity hole (the opening of the substrate transfer passage) adjacent to the space of the central processing location allows the plasma envelope which is present during plasma processing at the substrate processing location to expand into the cavity of the slit valve passage. The expansion of the plasma envelope into the cavity of the slit valve passage creates a distortion in the portion of the plasma situated adjacent to the cavity such that the plasma flux over the substrate in the area near the slit valve passage is affected, such that the deposition or etch taking place in that area is not uniform with other areas of the substrate where such distortion is not present.

Further, the internal surfaces of the slit valve passage, including the inside (process chamber facing side) of the slit valve door, are also subject to deposition and accumulation from the chemical process taking place in the chamber. Deposition on the inside surfaces of the slit valve passage and the slit valve door, require that any cleaning of the chamber (whether wet or dry) extend to include such surfaces. A thorough cleaning of the slit valve door requires that it also be removed so that the full area of the door all the way to the sealing limit be cleaned. In most instances, door cleaning requires that the cluster tool be removed from service so that cleaning of one chamber does not cause potential contaminants from one chamber serviced by the cluster tool to be carried over into a second chamber serviced by the same cluster tool.

The heavy duty sturdy construction of the processing chamber body and its liners finds no ready solution to the problem of the open cavity resulting from the slit valve passageway. Until now there has been no solution to overcome these anomalies of prior art devices, in that all prior doors are constructed in a configuration that gives rise to particles in the processing chamber.

SUMMARY OF THE INVENTION

A configuration according to the present invention overcomes the drawbacks of the prior art by providing an internal slit passage door which is cleverly constructed to improve the plasma uniformity over the substrate processing location and prevent deposition of chemical byproducts (such as polymers) in the slit valve passage. This second "internal" slit passage door is constructed as part of the chamber liner assembly so that when the chamber liner is replaced or a wet clean of the chamber liner is performed, the door is replaced and cleaned at the same time.

One configuration according to the invention includes a chamber body enclosing a substrate processing location space. The chamber body includes a slit passage extending from an outside surface of the body to the substrate processing location space, the slit passage being sized to pass a substrate therethrough. An outer slit valve door is positioned near the outside of the substrate transfer passage to seal the outer end of the slit passage to the chamber. An inner slit passage door is positioned in an inner portion of the substrate transfer passage to block the substrate transfer slit passage at a location near of adjacent to the substrate processing location.

Another configuration according to the invention can be defined with respect to a liner surrounding a substrate processing location in the vacuum processing chamber where the liner includes a substrate transfer opening therethrough. A liner door is selectively movable from an open position where the substrate to be processed can be passed, to a closed position where the liner door is located in close proximity to, but not touching the surrounding liner around the substrate transfer opening such that the edges of the door overlap edges of the substrate transfer opening. The overlap should preferably be approximately a half inch. The gap between the door in its fully closed position and the surrounding liner is in the range of several tens of thousands of an inch (several times 0.254 mm) all around, but the door never touches the liner during operation. The door is curved to match the configuration of a curved liner, for example, a circular liner configuration. The movement of the door is vertical and selectively supported and controlled through a series of bellows which act as the vacuum limit of the processing chamber. The vertical motion limit of the door is precisely set by a set of soft stops which prevent the door from touching the liner.

To reduce the chances for particle contamination, the bottom and top portions of the door are beveled to matched opposed beveled portions of the inner liner. With such a configuration the buildup of deposited material on the inner surface of the door will not interfere with raising the door, as the clearance between the door and liner will increase with each incremental distance that the door is moved from its fully closed position towards an open position.

The invention further includes a method for reducing the buildup of process byproducts on the surfaces of a substrate transfer passage and for improving the uniformity of plasma in a vacuum processing chamber utilizing the steps of: providing a movable door to selectively block the substrate transfer passage at a location adjacent to the substrate processing location in the vacuum processing chamber, and moving the movable door out of the substrate transfer passage when a substrate is being transferred to or from the substrate processing location. The door and door support structure may be movable between a door open position and a door closed position without rubbing contact between any two items within the vacuum limits of the processing chamber.

The door is opened simultaneously with the external slit valve door to permit passage of a substrate into and out of the chamber (for example, by a robot blade). The support for the door prevents lateral movement of the door and assists in positioning it precisely in its down position against a hard stop.

BRIEF DESCRIPTION OF THE DRAWINGS

FIG. 1 is a perspective view of a processing chamber according to the invention showing the outside of the chamber and a slit valve opening through which a substrate for processing can pass;

FIG. 2 is a partially exploded perspective view of the chamber top of FIG. 1, the inner slit valve door and its actuator are shown separated from the top flange of the processing chamber;

FIGS. 3A and 3B are exploded perspective views of the pieces of the inner slit passage door actuator and slit valve door according to the invention;

FIG. 4 is a top view of the slit passage door and actuator mechanism according to the invention;

FIG. 5 is a cross-sectional side view of a configuration of a vacuum processing chamber according to the invention showing the use of an external slit valve door and internal slit passage door in relationship to the substrate processing location of the processing chamber;

FIG. 6 is a cross-sectional view of the actuator mechanism for the internal slit passage door according to the invention with the door in an up position;

FIG. 7 is a cross-sectional view of the actuator mechanism as shown in FIG. 6 with the slit passage door according to the invention in a lower closed position;

FIGS. 8, 9 and 10 are progressive assembly steps for moving the slit passage door into position and securing it to its actuator showing the installation steps and the clearances between the inner slit valve door according to the invention and a liner configured to receive the inner slit valve for the door;

FIG. 11 is a cross-sectional view of a slit passage door according to the invention showing the location and configuration of lift rods which connect the actuator above;

FIGS. 12 and 13 show respectively the connections between the slit passage door and the lift rods, FIG. 12 showing a fixed connection while FIG. 13 shows a floating connection; and FIG. 14 shows a top view of the slit valve door showing the slotted opening for the floating lift rod of the door.

DETAILED DESCRIPTION

FIG. 1 shows a perspective view of a typical semiconductor wafer processing chamber 20. A frame 22 supports a chamber body 24. The chamber body 24 at its front side has a slit valve passage 28 with an outer slit valve door (that cannot be seen in FIG. 1) to seal the chamber and a chamber top assembly 26. Adjacent to the chamber top assembly 26 is an inner slit passage door actuator assembly 30 shown with its cover removed. Note that the inner slit passage door actuator assembly 30 is on the same side of the chamber body 24 as the slit valve passage 28 and the outer slit valve door (which cannot be seen) through which wafers are passed into and out of the chamber 20.

FIG. 2 is a partially exploded perspective view of the chamber liner and top assembly 40 including the inner slit passage door actuator assembly 30. A chamber top plate (or flange) 42 at its center supports a top plate electrode cover 44 and on the side adjacent the slit valve passage supports the inner slit passage door actuator assembly 30 which is located by dowel holes 46, 48. A pair of door lift rods, the left rod being the fixed lift rod 200 and the right rod being the floating lift rod 210 pass through their respective holes in the chamber top plate 42 to fit into holes in the top of inner slit passage door 60. As can be seen in FIG. 2 the inner slit passage door 60 is curved to match the radius of the chamber liner assembly 50. The inner slit passage door 60 is attached to the lift rods 200, 210 by a rod retaining screw 72 and a shoulder screw 82, respectively. The inner slit passage door 60 fits in a slit door recess 54 in the chamber liner assembly 50 so that when the inner slit passage door 60 is in its down position, it covers and overlaps the slit opening 52 in the liner assembly 50.

FIGS. 3A and 3B show an exploded perspective view of the parts of the inner slit passage door 60 and vertical actuator assembly 30. A top view of the assembled actuator assembly 30 is shown in FIG. 4, while a detailed cross-sectional view of the actuator assembly is shown in FIG. 6. In the description that follows, all of these Figures should be referenced to thoroughly understand how the door support rods 200, 210 support and precisely position the inner slit passage door 60 as it moves up and down.

An actuator base 100 is supported on the chamber top plate 42 (for example, as shown in FIG. 2). The base 100 includes a large dowel pin 186 and a small dowel pin 188 (FIG. 6) which fit into large and small dowel pin holes 46, 48, respectively, in the chamber top plate 42. The dowel pins fit tightly in these holes and their two different sizes prevent an incorrect installation. The lower surface of the actuator base 100 includes a set of two O-ring grooves each having an O-ring seal (e.g., 132, 134) surrounding the lift rods 200, 210 passing through openings in the bottom of the actuator based 100. A set of two bellows mounting tubes 102, 104 which are integral with the base 100 extend vertically from the bottom portion of the base to provide an enclosure for a set of rod lifting bellows assemblies 120, 140. Each rod lifting bellows assembly (e.g., 120, 140) includes an intricately assembled set of pieces which guide each of the lift rods as they move up and down and restrict their sideways motion while maintaining a vacuum seal across the bellows without any rubbing parts. Each rod lifting bellows assembly (e.g., 120, 140) includes a bellows central rod 128 which extends from a top of the assembly all the way through to its bottom. At the bottom of the assembly, a lower rod receiving portion 121 includes a threaded hole for receiving an upper end (e.g., 202) of one of the door lift rods (e.g., 200, 210). The lower portion 121 of the central rod 128 extends down below a lower bellows flange 122 that extends laterally outward from the central rod 128. At the perimeter of the lower bellows flange 122, a cylindrical set of corrugations form a cylindrical bellows attached to the perimeter of the flange 121. The upper end of the cylindrical bellows 123 is welded to an upper bellows flange 124. The perimeter of the upper bellows flange 124 extends out over the end of the top of the bellows mounting tube 102 and includes a downwardly facing inner recess to fit over a raised inner ledge/ seal flange 114 (FIG. 3A) of the bellows mounting tube 102, against which a sealing O-ring 106 is positioned. The bellows flange 124 at its center includes an upwardly extending guide bearing support tube 126. A tightly fitting lower rod guide bearing 125 is supported at a lower end of the guide bearing support tube 126, while an upper bellows rod guide bearing 127 is supported at an upper portion of the tube. A travel stop tube assembly 150 includes a lower flange 152 and a tube portion 154. The lower flange 152 sits on and seats against the upper bellows flange 124 and the upper surface of the bellows mounting tube 102. The travel stop tube assembly 150 surrounds the guide bearing support tube 126. The tube portion 154 of the travel stop assembly 150 extends to a tube end 158 which has an O-ring groove 156. An O-ring 168 is placed in the O-ring groove 156 and acts as a bumper to dampen the shock of stopping when the actuator assembly moves down and contacts the end 158 of the travel stop tube assembly 150. The travel stop tube assembly 150 acts as a hard stop to prevent further downward motion of the inner slit passage door 60.

The upper end of the bellows central rod (e.g., 128) is connected to a floating joint 174 which restricts vertical motion (Z-axis) but allows X-Y axis motion and also angular (spherical-type tilting) between the two halves of the joint. This floating joint allows for minor misalignments without creating any binding forces that might prevent an easily operable vertical stroke.

At the bottom end of the bellows central rod 128 a top end of the fixed lift rod 200 includes a threaded portion which is threaded into the hole in the lower portion of the bellows central rod 121 and also includes a flange which acts as a stop to tightly control the overall vertical dimension of the fixed lift rod 200 with respect to the bellows central rod 128. The flange contributes to achieving the tight tolerance in vertical positioning (spacing) that is very important in this configuration so that a specified gap between parts is maintained, but touching of such parts does not occur. In the configuration as shown, the lower portions of the two central rods shown, as will be discussed in detail later, are fixed to the inner slit passage door 60 by the fixed screw 72 and the shoulder screw 82.

Compared to the left side rod lifting bellows assembly 120 described above, the right side rod lifting bellows assembly 140 contains identical components and is sealed to a right side seal flange 116 by an O-ring 108 (FIG. 3A). The top end of the right side rod lifting bellows assembly 140 is also enclosed by a travel stop tube assembly 160 which contains an O-ring bumper 170 at its top surface and the central bellows rod of the right side (floating side) can connect to a right-side floating joint 176.

The two floating joints 174, 176 are connected at their top ends to a rod lift cross member 180 which is rigidly fixed to the pneumatic actuator rod 112 of a pneumatic actuator cylinder contained in a pneumatic actuator base 110 by a pneumatic actuator connection bolt 182. The limit of the upward vertical motion is set by the limit on the pneumatic actuator 110 and the motion limits of the pneumatic rod 112. High pressure air (for example, 60 to 80 psi (0.414 to 0.551 MPa)) is commonly used to move the actuator up or down as required. With such high pressure, the force will be fast acting and the rigidity of the pneumatic actuator rod 112 along with its tight clamping to the rod lift cross member 180 along with the use of floating joints 174 and 176 prevents there from being any binding as a result of the door lift rods or the bellows central rods being out of alignment with the pneumatic actuator 112.

FIG. 6 pictures the fully up position of the inner slit passage door 60 positioned above the top edge of the slit opening 52 in the liner assembly 50.

FIG. 7 shows the same elements of the actuator assembly as in FIG. 6 but the inner slit passage door 60 is shown in its lowered position and the positions of all actuator elements correspond to their positions when the rod lift cross member 180 contacts the tops of each of the travel tube assemblies 150, 160 to prevent the door 60 from descending further. In this configuration is can be seen that the inner slit passage door 60 overlaps the edges of the slit opening in liner 52 by an equal amount all around of approximately one half inch.

The vacuum limits of the processing chamber extend into the actuator assembly. The O-rings 132, 134 which the seal the bottom of the actuator base 100 against the top of the chambered top plate 42 provide one seal. A second seal is provided by the O-rings 106, 108 configured between the upper bellows flanges (e.g., 124) and the top end flange/lip 114 of the bellows mounting tube 102 (FIG. 3A). The cylindrical bellows corrugation (e.g., 123) which is welded between the lower bellows flange 122 and the upper bellows flange 124 completes the sealing/separation between the atmosphere and vacuum while still allowing the actual vertical movement without their being any particles generated as a result of rubbing two pieces within the vacuum chamber. The guiding of the central rod (e.g., 128) by the linear guide bearings (e.g., 125, 127) in the bellows assembly is located in atmosphere and particles thus generated have no effect on processing within the vacuum chamber.

An element of the proper location of the inner slit passage door 60 and its movement are the tight dimensional tolerances specified for the base 100. The use of an integral large base which is dimensioned and toleranced very tightly (several thousands of an inch in most instances) assures that appropriate dimensional relationships between the inner slit passage door 60 and the adjacent liner assembly 50 are maintained.

FIG. 4, a top view, shows the curved configuration of the inner slit passage door 60 with respect to the two rod lifting axes of the bellows assemblies 120, 140 as positioned on the base 100 of the actuator assembly 30.

FIG. 5 shows an elevational cross sectional view of a processing chamber with a substrate processing location 220 being located opposite a substrate transfer passage 222 such that a slit valve door 224 at the outside of the passage and the inner slit passage door 60 obstruct the passage of a substrate from the outside of the chamber to the substrate processing location 220. The slit passage actuator assembly 30 is located above the inner slit passage door 60 (some internal elements of the actuator assembly are not shown in this view).

FIGS. 8, 9, and 10 show the progressive installation sequence of the door 60 using cross sectional views along the vertical hole passages through the door which mate with the door lift rods 200, 210. In FIG. 8, the lift rod 210 is shown in a retracted (up) position with respect to the chamber top plate 42.

The inner slit passage door 60 has a lower counterbore bolt hole 61, a narrow pass through hole 63 and a top rod receiving hole 65. During assembly, the inner slit passage door 60 is moved into position under the door lift rods in the liner assembly 50.

The construction of the inner slit passage door 60 is such that the thickness of the door, (more particularly the position of its front face) changes from top to bottom such that there is a lower beveled face 62 at the bottom portion of the slit passage door 60, there is uniform thickness face area 64 (which here is shown straight (i.e., vertical), but in an alternate configuration may be may be slightly angled or beveled) and an upper beveled face 66 where the thickness of the door increases towards the top. The beveled faces match lower 84 and upper 86 beveled faces on the liner inner wall portions 94, 96 such that when in position as shown in FIG. 10, the gaps (e.g., 88, 90) between the front faces (62, 66) of the inner slit passage door 60 and the facing liner upper and lower surfaces (84, 86) are approximately several tens of thousandths of an inch (several times 0.254 mm).

The gap dimensions (e.g., 88, 90) are maintained to prevent any plasma (and processing byproducts such as polymers) from moving into the substrate transfer passage 222 as it does in the prior art. Further this gap is large enough so that the risk of the door touching (rubbing against) the liner during operation is minimized so that particles are not created, but the gap is tight enough so that plasma is choked and chemical byproducts (byproducts of the processing which tend to coat the surface of the processing chamber facing it) cannot pass through. Further build up of films which do deposit on the surface of the inner passage door 60 have a minimal effect in that the bevels on the face of the liner and the matching top and bottom and partial beveled surfaces bevel in the slit valve door mean that the closest approach between the liner and the door is when it is in a fully closed position. As soon as there is any motion to the open position, the gap, for example as shown in FIG. 9 and 10, gap dimension 90 in FIG. 10 increases tremendously to become gap dimension 92 in FIG. 9.

FIG. 3B shows in a perspective view the beveled orientations of the upper and lower chamber liner portions 94, 96 with their respect to faces 84, 86. The end 56 of the slit opening 52 is positioned short of the edge of the recess 54 in the liner assembly 50 so that once the inner slit passage door 60 is put into position the end of the door overlaps the end 56 of the slit 52 by a distance approximately equal to the overlap of the top and bottom edges as discussed above.

The progression of the assembly is shown in FIGS. 8, 9, 10. The retracted door lift rods receive the inner slit passage door and retaining screws are inserted and tightened so that the door can then be actuated. A frontal view of the door with the lift rods 200, 210 as shown in Figure II as might be expected, the door being made of aluminum will tend to expand and contract with variations in temperature, as will doors made of any material that has a coefficient of thermal expansion that tends to create binding on lift member depending on the dimensional relationships established and the range of temperatures to be accommodated.

The requirement of positional accuracy and the freedom for thermal expansion is accommodated by making one door support rod, the left rod 200 here, a fixed rod such that the end of the rod 200, for example, as shown in FIG. 12 is tightly clamped to the fixed hole configuration in the slit valve door. The machine screw 72 engaging the end of the rod tightly clamps the end of the rod 200 to the shoulders of the narrow pass through hole 63 in the inner slit passage door 60. This tight clamping provides a good electrical path to ground from the door, so that the possibility of arcing is reduced or eliminated, and further sets a horizontal and vertical position of one end of the door. This clamping acts as an anchor (or pivot) around which the other floating end of the door and its support can move.

FIG. 13 shows the right-hand rod, floating rod 210. Its rod receiving hole 68 is elongated in a sideways direction (e.g., FIG. 14) to allow for some expansion and contraction while the lower end of the rod is vertically fixed by a shoulder bolt 82 which clamps tightly against the bottom end of the floating rod 210. The narrowness of the slot 68 prevents sideways (radial) motion. Note that there is a gap 74 between the end of the rod and the inwardly protruding flanges (shoulders) of the rod through hole 63. The floating rod can thereby tilt, but is vertically fixed by the end flange (head) of the shoulder bolt 82 to allow free contraction and expansion of the slit passage door 60 as temperature variations take place about the fixed central axis of the fixed lift rod 200. Since the temperature variation is only approximately 100 to 150 degrees from ambient and the distance between the two lift rod holes is approximately six inches, the expansion will be quite manageable with this configuration.

A configuration according to the invention as has been described above typically includes an outer (chamber sealing) slit valve assembly. The present invention provides an inner slit passage door to block the deposition of polymers and other byproducts of the process in the chamber from depositing on the wall of the processing chamber. In this configuration the inside of the outer slit valve door does not have to be cleaned during a normal cleaning of the processing chamber. Therefore, the seal between a transfer chamber of a cluster tool is not affected if one of the chambers needs to be cleaned, whereas in the past, chamber cleaning always meant that the cluster tool and its transfer chamber was disrupted. Another benefit of a configuration using an inner slit passage door as described herein is to improve the uniformity of the distance between the edge of the substrate being processed at the substrate processing location in the chamber and the surrounding liner which defines the limits of the plasma envelope over the substrate. In the conventional configuration there was a large hole in the chamber liner which allowed plasma to expand into it. The expansion of plasma created a distortion on the plasma flux over the substrate being processed and variations in substrate processing from the side closest to the substrate transfer passage to the opposite side were noted. In a configuration according to the invention, the discontinuity in the plasma flux due to the slit transfer passage has bee eliminated, by the substitution of a door at the same electrical potential as the liner, to create a nearly uniform distance between the edge of the substrate being processed and the liner lining the wall of the processing chamber adjacent to the substrate. The configuration accomplishes this without substantially increasing the risk that particles will be generated in the chamber either by the movement of a dry door, or by movement of a door whose exposed surfaces have been coated with process byproducts. The bellows assembly seal provides dry sealing, without introduction of particles, while the cleverly curved and/or beveled surfaces of the door and the liners surfaces that it faces reduce the risk of polymer flake off, and peel off during operation. The door can be easily removed and cleaned as a unit with the liner assembly thereby simplifying the maintenance steps need to achieve a clean chamber, to return the chamber to production as soon as possible.

We claim:

1. A plasma processing chamber for confining a substrate processing plasma envelope, the chamber being connected to a substrate transfer chamber having an outer slit valve door, the chamber comprising:
    a hollow chamber body having an exterior surface and an interior surface;
    a chamber liner lining the interior surface of the hollow chamber body to confine the substrate plasma processing envelope and protect the interior surface from deposition of materials from the plasma;
    a substrate transfer passage extending from the outer slit valve door into the hollow chamber body and through the chamber liner; and
    an inner slit passage door disposed inside the hollow chamber body between the interior surface of the hollow chamber body and the chamber liner, the inner slit passage door being moveable so as to selectively block the substrate transfer passage.

2. The plasma processing chamber as in claim 1, wherein the passage door, when positioned to block the substrate transfer passage, extends beyond the edges of the substrate transfer passage by an overlap distance.

3. The plasma processing chamber as in claim 2, wherein said overlap distance is at least ¼ inch (6.35 mm).

4. The plasma processing chamber as in claim 2, wherein said overlap distance is approximately ½ inch (12.7 mm).

5. The plasma processing chamber as in claim 1, wherein the chamber liner is curved and the passage door is curved to match the configuration of the curved chamber liner.

6. The plasma processing chamber as in claim 2, wherein the chamber liner is curved and the passage door is curved to match the configuration of the curved chamber liner.

7. The plasma processing chamber as in claim 3, wherein the chamber liner is curved and the passage door is curved to match the configuration of the curved chamber liner.

8. The plasma processing chamber as in claim 1, wherein the passage door is moveable in a vertical direction and is selectively controlled through movement of a bellows assembly via which a support for the passage door is provided.

9. The plasma processing chamber as in claim 8, wherein the passage door is supported by two or more support rods.

10. The plasma processing chamber as in claim 1, wherein the passage door cooperates with the outer slit valve door to open simultaneously therewith so as to allow passage of a substrate in to and out of the chamber.

11. The plasma processing chamber as in claim 1, wherein the passage door in a closed position is located with a gap of several ten thousandths of an inch from a surface adjacent an opening of the substrate transfer passage at the chamber liner.

12. The plasma processing chamber as in claim 8, wherein the limit of the movement of the passage door in a vertical direction is precisely set by at least one soft stop.

13. The plasma processing chamber as in claim 2, wherein the passage door has a top portion and a bottom portion, the top and bottom portions of the passage door being beveled to match a bevel of opposed surfaces of the chamber liner that the top and bottom portions face.

14. The plasma processing chamber as in claim 13, wherein a center portion of the passage door is beveled to match an angled surface of a portion of a surface of the chamber liner through which the substrate transfer passage extends.

15. A substrate processing chamber for use with a sealing door, and enclosing a substrate processing location space, the chamber comprising:
    a hollow chamber body having an exterior surface and an interior surface, the interior surface defining the substrate processing location space, wherein a substrate transfer passage extends through the chamber body from the exterior surface to the interior surface, the substrate transfer passage being sized to pass a substrate therethrough;
    a door seat disposed where the substrate transfer passage terminates at the exterior surface of the hollow chamber body, the door seat being configured to cooperate with the sealing door to selectively seal said substrate transfer passage; and
    a passage door disposed inside the hollow chamber body, adjacent to the substrate transfer passage, and being moveable so as to selectively block the substrate transfer passage;
    wherein the passage door is moveable in a vertical direction and is selectively controlled through movement of a bellows assembly via which a support for said door is provided;
    wherein the passage door is supported by two or more support rods; and
    wherein a first of the two or more support rods is fixed to the passage door via a tightly clamped connection, wherein a second of the two or more support rods is connected to the passage door via a floating connection while maintaining the orientation of the passage door in a vertical direction and in a direction approximately perpendicular to a long axis of the passage door, the floating connection permitting the second support rod to move with respect to the passage door in a direction approximately along the long axis of the passage door.

16. A liner assembly for use in a plasma processing chamber th at confines a substrate processing plasma envelope and has a substrate transfer passage sized to permit movement into and out of the chamber of a substrate to be processed, the liner assembly comprising:
    a liner adapted to line the interior surface of the plasma processing chamber to confine the substrate plasma processing envelope and protect interior surfaces of the chamber from deposition of materials from the plasma, wherein the substrate transfer passage passes through the liner, and
    an inner slit passage door selectively movable from an open position to a closed position between the interior surface of the plasma processing chamber and the liner, wherein the open position permits the substrate to be processed to pass through the substrate transfer passage, and
    wherein in the closed position the inner slit passage door blocks the substrate transfer passage.

17. The liner assembly as in claim 16, wherein the liner is curved and the inner slit passage door is curved to match the configuration of the curved liner.

18. The liner assembly as in claim 16, where a movement of the door is vertical and is selectively controlled via a bellows assembly.

19. The liner assembly as in claim 16, wherein the inner slit passage door when positioned to block the substrate transfer passage extends beyond the edges of an opening in the liner by an overlap distance.

20. The liner assembly as in claim 19, wherein the overlap distance is at least ¼ inch (6.35 mm).

21. The liner assembly as in claim 19, wherein the overlap distance is approximately ½ inch (12.7 mm).

22. The liner assembly as in claim 16, wherein the inner slit passage door is supported by two support rods.

23. The liner assembly as in claim 16, wherein when an outer slit valve door of the chamber opens, the inner slit passage door opens substantially simultaneously therewith to allow passage of the substrate in to and out of the chamber.

24. The liner assembly as in claim 16, wherein the inner slit passage door in a closed position is located with a gap of several ten thousandths of an inch from a surface of the liner adjacent the substrate transfer passage.

25. The liner assembly as in claim 16, wherein the limit of the movement of the inner slit passage door in a vertical direction is precisely set by at least one soft stop.

26. The liner assembly as in claim 16, wherein top and bottom portions of the inner slit passage door are beveled to match opposed portions of a portion of a surface of the liner that they face.

27. The liner assembly as in claim 16, wherein a center portion of the inner slit passage door is beveled to match an angled surface of a portion of a surface of the liner through which the substrate transfer passage extends.

28. A liner assembly for use in a substrate vacuum processing chamber having a substrate processing location therein, the liner assembly comprising:
- a liner sized to surround the substrate processing location in the vacuum processing chamber, wherein the liner has a substrate transfer opening disposed therethrough, and
- a liner door selectively movable from an open position to a closed position,
- wherein the open position permits a substrate to be processed to pass through the substrate transfer opening,
- wherein in the closed position the liner door is positioned in close proximity to but not touching the liner all around the substrate transfer opening,
- wherein in the closed position the liner door blocks the substrate transfer opening,
- wherein in the closed position the edges of the liner door overlap the edge of the substrate transfer opening;
- wherein the liner door is supported by two support rods; and
- where a first of the two support rods is fixed to the liner door through a tightly clamped connection, while a second of the two support rods is connected to the liner door through a floating connection which maintains the liner door's orientation in a vertical direction and in a direction approximately perpendicular to a long axis of the liner door, and is free to move in a direction approximately along the long axis of the liner door.

29. A plasma processing chamber confining a substrate processing plasma envelope, the chamber being connected to a substrate transfer chamber having an outer slit valve door, the chamber comprising:
- a chamber body enclosing a substrate processing location space, the chamber body including a substrate transfer passage extending from the outer slit valve door to the substrate processing location space, the substrate transfer passage being sized to pass a substrate therethrough;
- a chamber liner lining the interior surface of the chamber body to enclose the substrate processing location space, confine the substrate plasma processing envelope, and protect the interior surface from deposition of materials from the plasma, wherein the substrate transfer passage extends through the chamber liner, and wherein the chamber liner has a door recess formed therein; and
- an inner slit passage door disposed in the door recess to selectively block the substrate transfer passage at the chamber liner.

30. A plasma processing chamber for use with an outer slit valve door, and enclosing a substrate processing location space, the chamber comprising:
- a hollow chamber body having an exterior surface and an interior surface;
- a substrate transfer passage extending from the outer slit valve door into the hollow chamber body to the substrate processing space; and
- an inner slit passage door disposed inside the hollow chamber body, adjacent to the substrate transfer passage, and being moveable so as to selectively block the substrate transfer passage; and
- a curved chamber liner lining the interior surface of the hollow chamber body to enclose the substrate processing location space and protect the interior surface from deposition of materials from the plasma, the chamber liner having both a slit passage and a door recess formed therein, the slit passage and the door recess being substantially aligned with the substrate transfer passage;
- wherein the passage door is positioned in the door recess, and is curved to match the configuration of the curved chamber liner and entirely block the slit passage when moved so as to selectively block the substrate transfer passage.

31. A plasma processing chamber confining a substrate processing plasma envelope, the chamber being connected to a substrate transfer chamber having an outer slit valve door, the chamber comprising:
- a chamber body enclosing a substrate processing location space, the chamber body including a substrate transfer passage extending from the outer slit valve door to the substrate processing location space, the substrate transfer passage being sized to pass a substrate therethrough;
- a chamber liner lining the interior surface of the chamber body to enclose the substrate processing location space, confine the substrate plasma processing envelope, and protect the interior surface from deposition of materials from the plasma, wherein the substrate transfer passage extends through the chamber liner; and
- an inner slit passage door disposed between the interior surface of the chamber body and the chamber liner to selectively block the substrate transfer passage at the chamber liner.

32. A plasma processing chamber for use with an outer slit valve door, and enclosing a substrate processing location space, the chamber comprising:
- a hollow chamber body having an exterior surface and an interior surface;
- a substrate transfer passage extending from the outer slit valve door into the hollow chamber body to the substrate processing space; and
- an inner slit passage door disposed inside the hollow chamber body, adjacent to the substrate transfer passage, and being moveable so as to selectively block the substrate transfer passage; and
- a curved chamber liner lining the interior surface of the hollow chamber body to enclose the substrate processing location space and protect the interior surface from deposition of materials from the plasma, the chamber liner having a slit passage formed therein, the slit passage being substantially aligned with the substrate transfer passage;

wherein the passage door is curved to match the configuration of the curved chamber liner and entirely block the slit passage when moved so as to selectively block the substrate transfer passage between the interior surface of the hollow chamber body and the chamber liner.

33. A plasma processing chamber for confining a substrate processing plasma envelope, the chamber being connected to a substrate transfer chamber having an outer slit valve door, the chamber comprising:

a hollow chamber body having an exterior surface and an interior surface;

a chamber liner lining the interior surface of the hollow chamber body to confine the substrate plasma processing envelope and protect the interior surface from deposition of materials from the plasma, the chamber liner having a door recess formed therein;

a substrate transfer passage extending from the outer slit valve door into the hollow chamber body and through the chamber liner; and an inner slit passage door disposed inside the hollow chamber body and being moveable so as to be positioned in the door recess to selectively block the substrate transfer passage.

34. The plasma processing chamber as in claim 33, wherein the passage door, when positioned to block the substrate transfer passage, extends beyond the edges of the substrate transfer passage by an overlap distance.

35. The plasma processing chamber as in claim 33, wherein the chamber liner is curved and the passage door is curved to match the configuration of the curved chamber liner.

36. The plasma processing chamber as in claim 33, wherein the passage door is moveable in a vertical direction and is selectively controlled through movement of a bellows assembly via which a support for the passage door is provided.

37. The plasma processing chamber as in claim 33, wherein the passage door in a closed position is located with a gap of several ten thousandths of an inch from a surface adjacent an opening of the substrate transfer passage at the chamber liner.

38. A liner assembly for use in a plasma processing chamber that confines a substrate processing plasma envelope and has a substrate transfer passage sized to permit movement into and out of the chamber of a substrate to be processed, the liner assembly comprising:

a liner adapted to line the interior surface of the plasma processing chamber to confine the substrate plasma processing envelope and protect interior surfaces of the chamber from deposition of materials from the plasma, wherein the substrate transfer passage passes through the liner and wherein the liner has a door recess formed therein, and an inner slit passage door selectively movable from an open position to a closed position in the door recess, wherein the open position permits the substrate to be processed to pass through the substrate transfer passage, and wherein in the closed position in the door recess the inner slit passage door blocks the substrate transfer passage.

39. The liner assembly as in claim 38, wherein the liner is curved and the inner slit passage door is curved to match the configuration of the curved liner.

40. The liner assembly as in claim 38, where a movement of the door is vertical and is selectively controlled via a bellows assembly.

41. The liner assembly as in claim 38, wherein the inner slit passage door when positioned to block the substrate transfer passage extends beyond the edges of an opening in the liner by an overlap distance.

42. The liner assembly as in claim 38, wherein top and bottom portions of the inner slit passage door are beveled to match opposed portions of a portion of a surface of the liner that they face.

43. The liner assembly as in claim 38, wherein a center portion of the inner slit passage door is beveled to match an angled surface of a portion of a surface of the liner through which the substrate transfer passage extends.

* * * * *